United States Patent [19]

Maeda et al.

[11] Patent Number: 4,908,043

[45] Date of Patent: Mar. 13, 1990

[54] METHOD OF PRODUCING CRYSTALS OF ANHYDROUS SODIUM SULFIDE

[75] Inventors: Kannosuke Maeda, Ashiya; Yoshio Aoyama, Kyoto, both of Japan

[73] Assignee: Sankyo Kasei Co., Ltd., Osaka, Japan

[21] Appl. No.: 210,463

[22] Filed: Jun. 23, 1988

[30] Foreign Application Priority Data

Jul. 23, 1987 [JP] Japan ................................ 62-185277

[51] Int. Cl.⁴ .......................... C01D 1/30; C01B 17/00
[52] U.S. Cl. .......................... 23/302 T; 423/561.1 W; 23/300
[58] Field of Search .................. 423/561 A; 23/302 T, 23/300

[56] References Cited

U.S. PATENT DOCUMENTS

| | | | |
|---|---|---|---|
| 1,699,377 | 1/1929 | Roos | 423/561 A |
| 1,774,560 | 9/1980 | Meyer | 423/561 A |
| 2,838,374 | 6/1958 | Beyer | 423/561 A |
| 3,666,140 | 5/1972 | Aoyama et al. | 423/561 A |

FOREIGN PATENT DOCUMENTS

| | | | |
|---|---|---|---|
| 1041480 | 10/1958 | Fed. Rep. of Germany | 423/561 A |
| 45-3652 | 2/1970 | Japan | 423/561 A |
| 363658 | 8/1972 | U.S.S.R. | 423/561 A |
| 712384 | 1/1980 | U.S.S.R. | 423/561 A |
| 929540 | 5/1982 | U.S.S.R. | 423/561 A |
| 284958 | 2/1928 | United Kingdom | 423/561 A |

*Primary Examiner*—Gary P. Straub
*Attorney, Agent, or Firm*—Armstrong, Nikaido, Marmelstein, Kubovcik & Murray

[57] ABSTRACT

Disclosed are single crystals of anhydrous sodium sulfide, and a method of producing single crystals of anhydrous sodium sulfide, characterized in that the method comprises concentrating an aqueous solution of sodium sulfide at a temperature of 97° C. or higher, the solution containing about 2 to about 15% by weight of NaOH based on the aqueous solution, to precipitate single crystals of anhydrous sodium sulfide from the aqueous solution.

4 Claims, 1 Drawing Sheet

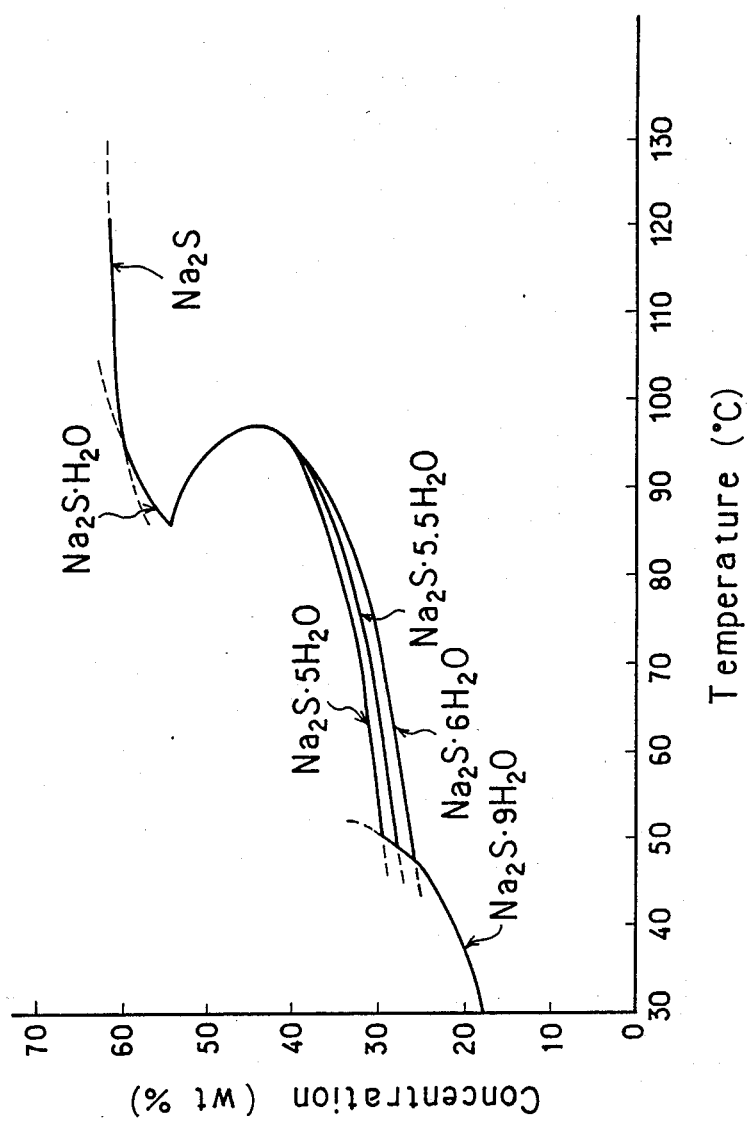

METHOD OF PRODUCING CRYSTALS OF ANHYDROUS SODIUM SULFIDE

In recent years, there is a demand for high-purity sodium sulfide which is useful as a material for production of engineering plastics or the like and which is easy to handle.

Conventional processes for preparing sodium sulfides include those in which $Na_2S$ crystals are precipitated from a $Na_2S$ aqueous solution. This crystallization from the aqueous solution gives hydrates of $Na_2S$ such as $Na_2S.9H_2O$, $Na_2S.6H_2O$, $Na_2S$ $5.5H_2O$, $Na_2S.5H_2O$, $Na_2S.H_2O$ and the like (Mellors, Comprehensive Treatise on Inorganic and Theoretical Chemistry, Vol. II, part I, pp. 621 to 629; Mellors, Comprehensive Treatise on Inorganic and Theoretical Chemistry, Supplement II, part I, pp. 980 to 989; Seidel, Solubilities, Inorganic and Metal-Organic Compounds Vol. II, pp. 1113; Japanese Examined Patent Publication No. 3760/1975; etc.).

However, the hydrates of $Na_2S$ as shown above are difficult to handle because they are significantly deliquescent and easily oxidizable in air. The foregoing crystallization has the further problem that NaSH or hydrogen sulfide is produced in the precipitation of $Na_2S$ crystals, whereby a complex salt, ion pair and the like are formed, consequently leading to production of $Na_2S$ with a low purity.

On the other hand, a process is known for preparing anhydrous sodium sulfide by thermal dehydration of hydrates of $Na_2S$ such as $Na_2S.9H_2O$ (Kirk-Othmer Encyclopedia of Chemical Technology, 2nd Ed. pp. 510 to 515; U.S. Pat. No. 2,533,163; The Merck Index, p. 1242; etc.). However, since anhydrous sodium sulfide is produced by forced dehydration of hydrates in this process and assumes the skeletal crystal form of $Na_2S$ retaining the original crystal form of hydrates, they are great in specific surface area and readily oxidizable.

An object of the present invention is to provide high-purity single crystals of anhydrous sodium sulfide which are unlikely to deliquesce and to oxidize.

Another object of the invention is to provide a method of producing high-purity single crystals of anhydrous sodium sulfide with ease.

Other features of the invention will become apparent from the following description.

The present invention provides single crystals of anhydrous sodium sulfide, and also provides a method of producing single crystals of anhydrous sodium sulfide, characterized in that the method comprises concentrating an aqueous solution of sodium sulfide at a temperature of 97° C. or higher, the solution containing about 2 to about 15% by weight of NaOH based on the aqueous solution, to precipitate single crystals of anhydrous sodium sulfide from the aqueous solution.

The present inventors conducted research to develop anhydrous sodium sulfide having a high purity and easy to handle, and discovered a phenomenon hitherto unknown that when an aqueous solution of $Na_2S$ is concentrated at a high temperature, i.e. 97° C. or higher, anhydrous sodium sulfide crystals are precipitated. Another finding was that when a specific amount of NaOH is present in the $Na_2S$ aqueous solution, single crystals of anhydrous sodium sulfide can be continuously formed with a high purity.

The single crystals of anhydrous sodium sulfide thus prepared are novel materials which have not been heretofore obtained.

FIG. 1 is a curve showing the solubility of hydrates of $Na_2S$. As seen from FIG. 1, anhydrous sodium sulfide crystals are precipitated from the aqueous solution of $Na_2S$ at or above 97° C. This shows that $Na_2S$ is separated out as an anhydrous crystal by concentrating the $Na_2S$ aqueous solution to supersaturation while retaining the aqueous solution at 97° C. or higher. This phenomenon was discovered for the first time by the present inventors.

In the $Na_2S$ aqueous solution, $Na_2S$ is in equilibrium with NaSH and NaOH according to the formula (1) given below and NaSH is in equilibrium with NaOH and $H_2S$ as illustrated below according to the formula (2).

$$NaSH + NaOH \rightleftharpoons Na_2S + H_2O \qquad (1)$$

$$NaOH + H_2S \rightleftharpoons NaSH + H_2O \qquad (2)$$

These two reactions are reversible ones in which when $Na_2S$ is present at a high concentration, the position of equilibrium is shifted toward the formation of NaSH and hydrogen sulfide. When large amounts of these impurities, i.e. NaSH and hydrogen sulfide, are contained in the aqueous solution, a complex salt, ion pair and the like are formed, the solubility, ionic strength and other properties of $Na_2S$ are changed and the impurities are incorporated into the crystalline structure of $Na_2S$ with the result that it becomes difficult to obtain pure single crystals of $Na_2S$.

To prevent the occurrence of such phenomena, the $Na_2S$ aqueous solution must contain about 2 to about 15% by weight, preferably about 5 to about 10% by weight, of NaOH in the formation of $Na_2S$ crystals so that $Na_2S$ is stably present in the aqueous solution by shifting the position of equilibrium toward the formation of $Na_2S$. Anhydrous sodium sulfide can be continuously formed as single crystals from such aqueous solution containing an excess amount of NaOH.

According to the present invention, there is no specific limitation on the kind of $Na_2S$ aqueous solution to be used for the formation of $Na_2S$ crystals. However, it is desirable to use an $Na_2S$ aqueous solution prepared by reacting NaSH with NaOH in equimolar amounts in preference to an aqueous solution having dissolved therein hydrates of $Na_2S$ such as $Na_2S.9H_2O$.

When the hydrates of $Na_2S$ are dissolved in water for use, an aqueous solution of $Na_2S$ can not be prepared directly at a high concentration due to the presence of crystallization water in the hydrates so that it may become necessary to concentrate the aqueous solution before its feed to a crystallizer. However, when a $Na_2S$ aqueous solution is concentrated, equipment such as heat exchanger or the like is likely to be corroded by $Na_2S$ which is significantly corrosive. In contrast, the reaction of NaSH and NaOH directly produces a $Na_2S$ aqueous solution at a high concentration of 50% by weight or more, making it possible to simplify the concentrating procedure.

The reaction between NaSH and NaOH can be performed in an aqueous solution thereof according to the conventional method.

When impurities exist in an aqueous solution of $Na_2S$, it is difficult to obtain pure single crystals of $Na_2S$. To overcome this difficulty, the impurities contained in the starting materials, such as $Na_2CO_3$, $Na_2SO_3$, sodium thiosulfate and the like, are preferably removed to the utmost extent from the $Na_2S$ aqueous solution after its preparation in order to prevent the inclusion of the impurities in Na₂S crystals. For this purpose, a Na₂S aqueous solution is preferably supplied, before its feed to a crystallizer, to a precipitator wherein the precipitate formed is eliminated by filtration or other means. The impurities as shown above which are sparingly soluble in a Na₂S aqueous solution having a high concentration can be separated out by leaving the solution to stand at a Na₂S concentration of about 30% by weight or more in the precipitator for about 1 to about 5 hours.

After preparation of a Na₂S aqueous solution or after removal of impurities therefrom, the Na₂S aqueous solution is charged into a crystallizer wherein the solution is concentrated and is caused to form single crystals of Na₂S. The solution temperature in the crystallizer must be about 97° C. or higher, preferably about 100° to about 120° C. If the solution temperature in the crystallizer is lower than 97° C., hydrates of Na₂S are produced, consequently resulting in failure to form single crystals of anhydrous sodium sulfide.

For stable formation of Na₂S single crystals, it is desirable that the Na₂S aqueous solution be rendered stable by being maintained at 97° C. or higher for at least about 1 hour, preferably at least about 5 hours, before its feed to the crystallizer. Therefore, in the case of carrying out the removal of impurities, the solution is held in the precipitator preferably at 97° C. or higher.

In crystallization, the Na₂S aqueous solution must contain NaOH in an amount of about 2 to about 15% by weight, preferably about 5 to about 10% by weight, based on the solution. As seen from the formula (1) given above, the presence of excess NaOH inhibits the dissociation of Na₂S and restrains the formation of NaSH, thereby making it possible to form single crystals of anhydrous sodium sulfide. NaOH may be initially added in an excess amount relative to NaSH as the starting material for synthesis of Na₂S or alternatively may be added in the precipitator or in the crystallizer.

The other operational conditions in the crystallization are not specifically limited insofar as Na₂S single crystals can be formed by concentrating the Na₂S aqueous solution maintained at the specific temperature range. The crystallization can be carried out under atmospheric or reduced pressure and the equipment used for crystallization is not critical.

According to the method of the present invention, single crystals of anhydrous sodium sulfide hitherto unobtainable can be easily produced. The Na₂S crystals thus formed are usable for various applications because of high purity, diminished tendencies to deliquesce and to oxidize and ease of handling.

The present invention will be described below in more detail with reference to the following Examples and Comparison Examples.

EXAMPLE 1

A 60 wt % aqueous solution of NaSH was fed at a rate of 1200 kg/hr and NaOH flakes (98% purity) at a rate of 525 kg/hr to a reactor maintained at a temperature of 100° C. to carry out reaction. The reaction gave a 58 wt % aqueous solution of Na₂S which was then introduced into a precipitator maintained at 100±2° C. In the precipitator, the microcrystals were separated out and the supernatant liquid was transferred to a crystallizer. The microcrystals deposited in the precipitator were removed by a filter and the filtrate was sent to the crystallizer.

The crystallizer was operated under the conditions: about 3,000 kg in the amount of crystals contained therein, about 3 hours in the residence time, about 70% in the ratio of space occupied by the crystals formed, 106° C. in the temperature, 62 torr in the degree of vacuum, and 0.11 wt % by which the Na₂S was dissolved beyond the saturation point. The concentration of NaOH in the crystallizer was checked at regular intervals during operation and maintained at 5.0±0.3%. The amount of evaporation was 500 kg per hour. High-purity single crystals of anhydrous sodium sulfide were collected at a rate of 1000 kg/hr.

The same procedure as above for synthesis of Na₂S were repeated three times under the same conditions. Table 1 below shows the results of analysis of Na₂S obtained.

TABLE 1

| | Specimen No. | | |
|---|---|---|---|
| Appearance | 1<br>*1 | 2<br>*2 | 3<br>*3 |
| Crystalline size | 1.4 mm | 1.4 mm | 1.5 mm |
| Na₂S (%) | 97.6 | 98.1 | 98.6 |
| Na₂S₂O₃ (%) | 0.5 | 0.21 | 0.34 |
| Na₂SO₃ (%) | 0.91 | 0.82 | 0.87 |
| Na₂CO₃ (%) | 0.42 | 0.63 | 0.12 |
| NaSH (%) | Trace | Trace | — |
| Iron (%) | — | 0.0004 | Trace |

(Note: *1, *2, *3; Specimens Nos. 1, 2 and 3 had the appearance of hexagonal isometric crystals.)

EXAMPLE 2

Crystallization was effected by repeating the same procedure as in Example 1 except that the aqueous solution of Na₂S containing 8.2% by weight of NaOH was used in the crystallizer. The Na₂S was obtained in the form of hexagonal isometric single crystal and was entirely free of NaSH, hence highly pure.

COMPARISON EXAMPLE 1

Crystallization was conducted by repeating the same procedure as in Example 1 except that the aqueous solution of Na₂S containing 0.7% by weight of NaOH was used in the crystallizer. The Na₂S thus obtained had a NaSH content of about 2.72%, hence low in purity.

COMPARISON EXAMPLE 2

Reaction was conducted in a reactor having a 70 wt % aqueous solution of NaSH fed at a rate of 980 kg/hr and 65 wt % aqueous solution of NaOH fed at a rate of 715 kg/hr and maintained at 105±2° C., giving an aqueous solution of Na₂S. The solution was sent to a precipitator maintained at 92° C. wherein the crystals deposited were filtered off.

The supernatant liquid at 92° C. was then sent without heating to the same crystallizer as used in Example 1 wherein Na₂S crystals were formed. The crystallizer was operated under the conditions: 108° C. in the temperature, 68 torr in the degree of vacuum, 738 kg/hr in the evaporation rate and 6.5% by weight in the amount of free NaOH. Since the supernatant liquid was sent to the crystallizer at a temperature lower than the predetermined level, the solution was concentrated to abnormally high level of supersaturation, resulting in failure to form single crystals of anhydrous sodium sulfide and in the production of an aggregate composed of microcrystals irregular in crystalline size and mixed with water-containing crystals.

We claim:

1. A method of producing anhydrous sodium sulfide in the form of hexagonal isometric crystals having a purity of 97.6% or more, which comprises maintaining an aqueous solution of sodium sulfide containing from about 2 to about 15% by weight of NaOH at a temperature of 97° C. or higher for at least 1 hour, and then concentrating the solution at a temperature of 97° C. or higher to precipitate the anhydrous sodium sulfide crystals from the solution.

2. A method according to claim 1, wherein the aqueous solution contains from about 5 to about 10% by weight of NaOH.

3. A method according to claim 1, wherein the solution is concentrated at a temperature of about 100° to about 120° C.

4. A method according to claim 1, wherein the concentration of the sodium sulfide in the aqueous solution is 30% or more by weight and wherein solid impurities which precipitate while the solution is maintained at a temperature of 97° C. or higher are removed prior to concentrating the aqueous solution.

* * * * *